US005382385A

United States Patent [19]

Ochi et al.

[11] Patent Number: 5,382,385

[45] **Date of Patent: * Jan. 17, 1995**

[54] SINTERED VARISTOR MATERIAL WITH SMALL PARTICLE SIZE

[75] Inventors: Hideo Ochi, Misato; Akihide Igari; Masaaki Toyoda, both of Saitama; Zenbee Nakagawa, Yokohama, all of Japan

[73] Assignee: Somar Corporation, Japan

[ * ] Notice: The portion of the term of this patent subsequent to Dec. 17, 2008 has been disclaimed.

[21] Appl. No.: 856,571

[22] Filed: Mar. 24, 1992

[30] Foreign Application Priority Data

Sep. 30, 1991 [JP] Japan .................................. 3-278649

[51] Int. Cl.⁶ ......................... H01B 1/06; H01L 45/00

[52] U.S. Cl. ..................................... 252/519; 252/518; 257/4; 257/43

[58] Field of Search ............... 252/518, 519, 520, 527; 257/4, 43

[56] References Cited

U.S. PATENT DOCUMENTS

| | | | |
|---|---|---|---|
| 3,899,451 | 8/1975 | Ichinose et al. | 252/518 |
| 3,928,242 | 12/1975 | May | 252/518 |
| 3,953,371 | 4/1976 | May | 252/518 |
| 4,285,839 | 8/1981 | Wong | 252/519 |
| 4,296,002 | 10/1981 | Sokoly et al. | 252/519 |
| 4,397,775 | 8/1983 | Levinson | 252/519 |
| 4,559,167 | 12/1985 | Jülke et al. | 252/519 |
| 4,700,169 | 10/1987 | Tanno | 252/519 |
| 4,894,185 | 1/1990 | Djega-Mariadassou et al. | 252/518 |
| 5,039,452 | 8/1991 | Thompson et al. | 252/519 |
| 5,073,302 | 12/1991 | Igari et al. | 252/518 |
| 5,076,979 | 12/1991 | Ochi et al. | 252/518 |
| 5,143,651 | 9/1992 | Caffin | 252/519 |

FOREIGN PATENT DOCUMENTS

| | | |
|---|---|---|
| 0320196 | 6/1989 | European Pat. Off. |
| 0346895 | 12/1989 | European Pat. Off. |
| 0404981 | 1/1991 | European Pat. Off. |
| 0409501 | 1/1991 | European Pat. Off. |

*Primary Examiner*—Rolf Hille
*Assistant Examiner*—Mahshid Saadat
*Attorney, Agent, or Firm*—Lorusso & Loud

[57] ABSTRACT

A varistor material having a non-linear coefficient of at least 30 and a varistor voltage of at least 800 V/mm is disclosed. The varistor is produced by a method including commingling an admixture of ZnO and a manganese compound while preventing the admixture from contacting with a surface containing an element belonging to group IIIb of the Periodic Table. The resulting mixture is calcined and then pulverized while preventing the contact with a IIIb element-containing surface to obtain a pulverized product having a content of impurity compounds of a IIIb element of not greater than 20 ppm by weight. The pulverized product is molded and sintered at such a temperature as to obtain the varistor formed from particles with an average particle size of not greater than 5 μm.

7 Claims, No Drawings

SINTERED VARISTOR MATERIAL WITH SMALL PARTICLE SIZE

BACKGROUND OF THE INVENTION

This invention relates to a zinc oxide (ZnO) varistor material and a method of producing same.

It is widely known that a sintered ZnO mixed with small amounts of bismuth oxide ($Bi_2O_3$) and other additives has high non-linear current-voltage characteristics. Such a material, generally called varistor material, has been widely applied to the voltage stabilization or to the absorption of transient surge in electric circuits by taking advantage of the non-linear between its voltage and current. The relationship between the electric current and voltage of a varistor may be expressed by the following empirical equation:

$$I=(V/C)^{\alpha}$$

wherein V represents an electric voltage applied to the varistor, I represents an electric current passing therethrough, C is a constant and $\alpha$ is a non-linear coefficient. The non-linear coefficient $\alpha$ is calculated according to the following equation:

$$\alpha=\log (I_2/I_1)/\log(V_2/V_1)$$

wherein $V_1$ and $V_2$ each represent the electric voltage at given current $I_1$ and $I_2$.

$I_1$ and $I_2$ are generally determined at 1 mA and 10 mA, respectively and $V_1$ is called a varistor voltage. The non-linear coefficient varies with the composition and production method of the varistor material. Generally speaking, a varistor material with as large a non-linear coefficient as possible is preferred.

Although several theories have been reported relating to the mechanisms of the expression of non-linear current-voltage characteristics of ZnO varistors, no definite one has been established so far. However, it is recognized that the electric properties of a varistor originate from its grain boundaries. A ZnO varistor generally contains ZnO grains around which a highly resistant boundary layer is located and bound thereto. Additives are employed in order to form this boundary layer. A number of additives are generally used and the types and amounts thereof may vary depending on the properties sought.

A ZnO varistor material has been hitherto prepared as follows. Several additives such as oxides of Bi, Co, Mn, Sb, Cr and the like metals are mixed with ZnO powder and dried. The dried mixture is molded into a desired shape and subsequently sintered. During the sintering stage, the mixture is reacted to give a varistor material. A varistor element is obtained by fitting electrodes and conductors to the varistor material.

Known ZnO varistor materials have a varistor voltage of about 200 V/mm. Thus, when a high varistor voltage is desired, such as in the case of utilization in a lightning arrester, such varistors must have a large thickness. For example, a thickness of about 3.5 m is required for obtaining a varistor voltage of 700 KV with a varistor material having a varistor voltage of 200 V/mm. Such a large varistor element causes a difficulty in electrical insulation, a large increase in production costs and a limitation in selecting the installation position. Thus, there is a great demand for a varistor material with a high varistor voltage.

It is known that the voltage drop per grain boundary of a ZnO varistor is about 2–4 V and is independent from the composition or production process parameters. Therefore, if the growth of grains at the sintering stage can be suppressed, a varistor material with a high varistor voltage per unit thickness may be obtained.

However, ZnO varistor materials generally contain bismuth oxide, strontium oxide or barium oxide which forms a liquid phase on the boundary layers at the sintering stage to accelerate the growth of grains. For the purpose of suppressing the growth of grains in such ZnO varistors, the following methods are proposed. One proposal is to effect the sintering at a low temperature of up to 1100° C. Since sintering fails to proceed effectively at such a temperature, however, it is necessary to adopt a special measure. As a result, the production method becomes complicated and is difficult to perform quality control. Another proposal is to use an inhibitor such as antimony oxide or silicon oxide. Since such an inhibitor should be used in a relatively large amount in order to obtain a desired result, problems are caused with respect to heterogeneity of the product and reduction of surge resistance.

A varistor material containing ZnO and $ZnMn_2O_4$ is proposed in U.S. Pat. No. 5,073,303 and in U.S. Pat. No. 5,076,797. No specific examples are disclosed in this prior art which show varistors with a varistor voltage of 800 V or more per 1 mm of the thickness thereof. Further, it is described that the desired high non-linear coefficient cannot be obtained when the content of MnO is outside of a range of 3–7 mole % based on a total of ZnO and MnO.

SUMMARY OF THE INVENTION

The present invention has been made with the foregoing problems of conventional techniques in view and provides a novel varistor material having a high varistor voltage.

In accordance with one aspect of the present invention there is provided a varistor material having a varistor electric voltage of at least 800 V/mm, a non-linear coefficient of at least 30, a specific resistivity of at least $1\times10^9$ ohm.cm and a composition consisting essentially of 85–97 mole % of ZnO and 3–15 mole % of MnO.

In another aspect, the present invention provides a method of producing a varistor material, comprising the steps of:

providing an admixture containing 85–97 mole % of ZnO powder having an average particle diameter of not greater than 1 μm and 3–15 mole % of a manganese compound;

commingling said admixture in a mixer while substantially preventing contamination of said mixture with an impurity containing an element belonging to Group IIIb of the Periodic Table to obtain a mixture;

calcining said mixture at a temperature of 600°–900° C. in an oxygen-containing atmosphere to obtain a calcined product;

pulverizing said calcined product while substantially preventing contamination of said calcined product with an impurity containing a metal belonging to Group IIIb of the Periodic Table to obtain a pulverized product having a content of impurity compounds of an element belonging to IIIb of the Periodic Table of not greater than 20 ppm by weight;

molding said pulverized product to obtain a shaped body; and sintering said shaped body at a temperature of 1100°-1300° C. in an oxygen-containing atmosphere to obtain a sintered body formed from grains with an average grain diameter of not greater than 5 μm.

The term "average grain diameter" used in the present specification for the sintered body is intended to refer to a diameter of average grain measured according to the planimetric method by Jeffries (Jeffries, Z., Metallurgical and Chemical Engineering, 18, 185 (1918)). The diameter (d) of average grain is calculated according to the following equation: $d=2/\sqrt{\pi n}$ wherein n represents the number of grains per square micrometer.

DESCRIPTION OF THE PREFERRED EMBODIMENTS

The present invention will now be described in detail below.

The varistor material according to the present invention has a composition of 85-97 mole % of ZnO and 3-15 mole % of manganese oxide (MnO), preferably 85-92 mole % of ZnO and 8-15 mole % of MnO. With an increase in amount of MnO from 3 mole %, the non-linear coefficient increases. The increase is prominent when the amount of MnO is greater than 8 mole %. An amount of MnO in excess of 15 mole % is disadvantageous because the specific resistivity of the varistor material is less than $1\times10^9$ ohm.cm. A specific resistivity of lower than $1\times10^9$ ohm.cm is disadvantageous because a leakage current tends to increase and the thermorunaway life of the varistor is shortened.

It is important that the average grain diameter of the grains constituting the varistor material should be not greater than 5 μm, preferably 1-5 μm, since otherwise a high varistor voltage of 800 V/mm or more cannot be obtained.

The varistor material of the present invention may be produced as follows. First, a homogeneous mixture of ZnO powder and a manganese compound is prepared. The ZnO powder should have an average particle diameter of not greater than 1 μm, preferably not greater than 0.5 μm. The use of a highly pure ZnO powder is recommendable. Such ZnO powder is commercially available.

Any manganese compound may be used for the purpose of the present invention as long as it can be converted into MnO upon calcination. Examples of suitable manganese compounds include manganese oxide, manganese nitrate, manganese acetate and manganese carbonate.

The mixing of the MnO powder and the manganese compound may be performed by dry mixing or wet mixing. When the dry mixing is adopted, the manganese compound should be finely pulverized to an average particle size of not greater than 1 μm, preferably not greater than 0.5 μm. For the purpose of obtaining a homogeneous mixture, it is preferable to dissolve the manganese compound in a suitable solvent and to mix the resulting solution with ZnO powder. As such a solvent, water or an organic solvent which does not interact with ZnO and which is easily removed by evaporation is used. Illustrative of suitable organic solvents are methanol, ethanol and methyl ethyl ketone.

It is important that the mixing of the ZnO powder with the manganese compound should be performed while substantially preventing contamination of other metal components, especially those belonging to Group IIIb of the Periodic Table, i.e., B, Al, Ga, In and Tl. In the production of varistor materials, it has been a general practice to use an alumina pot mill. The present inventors have found that impurities of metal compounds, such as $Al_2O_3$ and $B_2O_3$, contained in ZnO varistors considerably adversely affect the characteristics thereof, such as reduction of the varistor voltage, non-linearity coefficient and specific resistance. Thus, in mixing the ZnO powder with the manganese compound, it is recommendable to use a pot mill formed of a synthetic resin or to use a pot mill whose inside surface is lined with a synthetic resin.

The thus obtained wet mixture is then dried by removal of the solvent, followed by calcination at a temperature of 600°-900° C. in an oxygen-containing atmosphere. A calcination temperature of below 600° C. is insufficient to effect the reaction of the ZnO powder with the manganese compound. When the calcination temperature exceeds 900° C., grain growth and adhesion of the ZnO powder tends to occur.

The calcined mass is then pulverized into particles of an average particle diameter of, for example, 2 μm or less, preferably 1 μm or less. For the same reason as set forth above, the pulverization should be performed while substantially preventing contact with metal containing surfaces, especially those containing elements belonging to Group IIIb of the Periodic Table. By using a synthetic resin pot mill or a pot mill lined with a synthetic resin in performing the mixing and pulverization, the concentration of impurities of an element of IIIb Group can be controlled well below 20 ppm by weight.

The thus obtained particulate product is subsequently molded into a desired shape and the shaped body is then sintered at a temperature within the range of 1,100°-1,300° C., preferably 1,100°-1,250° C., for about 0.5-3 hours in an oxygen-containing atmosphere so as to obtain a varistor material formed of grains having an average grain diameter of not greater than 5 μm. A sintering temperature of below 1,100° C. is insufficient to effect sintering within an acceptable period of time. When, on the other hand, the sintering is performed at a temperature of 1,300° C. or more, deformation of the sintered body is apt to occur. As the sintering temperature is lowered, the average grain diameter of the sintered body is reduced with the simultaneous increase in the varistor voltage per unit thickness.

The following examples will further illustrate the present invention.

EXAMPLE 1

ZnO powder (manufactured by Seido Kagaku Kogyo K. K., purity 99.85%, average particle diameter: 0.5 μm) was mixed, in methyl ethyl ketone, with manganese nitrate ($Mn(NO_3)_2\cdot6H_2O$) in an amount of 8 mole % as MnO based on the total amount of ZnO and MnO. The mixing was performed for 24 hours in a pot mill lined with a polyurethane layer. The mixture was dried at 120° C. for 15 hours and calcined, in a crucible, at 700° C. for 1 hour. The calcined mixture was wet-milled using the above pot mill and dried. It was found that the contents of $Al_2O_3$ and $B_2O_3$ in the pulverized product were less than 5 ppm by weight and less than 1 ppm by weight, respectively. The pulverized product was then shaped under a pressure of 300 kg/cm$^2$ into a disc with a diameter of 10 mm and a thickness of about 1 mm using molds whose inside surfaces were lined with a phenol resin. The disc was sintered at 1,100° C. for 1 hour in air. The resulting sintered disc (Sample No. 1) was measured for its density and average grain diameter. Further, the disc was polished and applied with a coating of indium-mercury amalgam to form an electrode on each of the opposite surfaces for the measurement of its varistor voltage, non-linear coefficient and specific resistance. The density was measured according to the Archimedes's method and is expressed by a percentage based on the theoretical density of the single phase pure ZnO. The average grain diameter of the sintered disc was calculated by the Jeffries' planimetric method using the scanning electron microscope photograph of a cut surface of the sintered disc, which surface was polished to a mirror-finished and thermally etched at 1,100° C. for 1 minute.

The above procedure was repeated using various amounts of MnO and the sintering temperatures as shown in Tables 1 and 2 to give Samples Nos. 2-43. The characteristics of these samples were as summarized in Tables 1 and 2.

TABLE 1

| Sample No. | Sintering Temperature (°C.) | Content of MnO (mole %) | Varistor Voltage (V/mm) | Non-Linear Coefficient | Specific Resistivity (ohm · cm) | Density (%) | Average Grain Diameter (μm) |
|---|---|---|---|---|---|---|---|
| 1 | 1100 | 8 | 2600 | 110 | $2 \times 10^{10}$ | 97.2 | 1.2 |
| 2 | 1100 | 10 | 3100 | 120 | $1 \times 10^{10}$ | 97.0 | 1.1 |
| 3 | 1150 | 8 | 2380 | 108 | $1 \times 10^{10}$ | 97.4 | 1.9 |
| 4 | 1150 | 10 | 2880 | 100 | $2 \times 10^{10}$ | 97.0 | 1.8 |
| 5 | 1150 | 12 | 2900 | 98 | $2 \times 10^{10}$ | 96.9 | 1.8 |
| 6 | 1150 | 15 | 2820 | 94 | $1 \times 10^{9}$ | 96.8 | 1.7 |
| 7 | 1150 | 20 | 1580 | 17 | $3 \times 10^{7}$ | 95.6 | 1.2 |
| 8 | 1200 | 8 | 2550 | 61 | $2 \times 10^{10}$ | 96.1 | 2.2 |
| 9 | 1200 | 10 | 2820 | 100 | $1 \times 10^{10}$ | 97.1 | 2.1 |
| 10 | 1200 | 12 | 2900 | 90 | $2 \times 10^{9}$ | 96.5 | 2.0 |
| 11 | 1200 | 15 | 3010 | 79 | $3 \times 10^{8}$ | 95.8 | 1.7 |
| 12 | 1200 | 20 | 2020 | 67 | $5 \times 10^{7}$ | 95.3 | 1.2 |
| 13 | 1250 | 8 | 2220 | 105 | $1 \times 10^{9}$ | 97.0 | 2.7 |
| 14 | 1250 | 10 | 2410 | 95 | $2 \times 10^{9}$ | 97.7 | 2.2 |
| 15 | 1250 | 12 | 2460 | 95 | $2 \times 10^{9}$ | 96.6 | 2.3 |
| 16 | 1250 | 15 | 2520 | 90 | $1 \times 10^{9}$ | 95.7 | 2.1 |
| 17 | 1250 | 20 | 2610 | 100 | $2 \times 10^{8}$ | 95.7 | 1.3 |
| 18 | 1300 | 8 | 340 | 5 | $4 \times 10^{6}$ | 98.2 | 5.0 |
| 19 | 1300 | 10 | 1630 | 41 | $1 \times 10^{8}$ | 97.5 | 3.5 |
| 20 | 1300 | 12 | 2390 | 84 | $1 \times 10^{9}$ | 96.7 | 3.2 |
| 21 | 1300 | 15 | 2000 | 37 | $2 \times 10^{8}$ | 95.8 | 3.0 |

TABLE 2

| Sample No. | Sintering Temperature (°C.) | Content of MnO (mole %) | Varistor Voltage (V/mm) | Non-Linear Coefficient | Specific Resistivity (ohm · cm) | Density (%) | Average Grain Diameter (μm) |
|---|---|---|---|---|---|---|---|
| 22 | 1100 | 0.5 | 80 | 3 | $2 \times 10^{6}$ | 98.0 | 2.8 |
| 23 | 1100 | 1 | 180 | 7 | $4 \times 10^{7}$ | 96.1 | 2.9 |
| 24 | 1100 | 2 | 980 | 31 | $2 \times 10^{8}$ | 96.6 | 2.7 |
| 25 | 1100 | 3 | 1990 | 60 | $7 \times 10^{10}$ | 97.3 | 2.2 |
| 26 | 1100 | 4 | 1990 | 88 | $4 \times 10^{10}$ | 96.2 | 1.9 |
| 27 | 1100 | 5 | 2450 | 93 | $6 \times 10^{10}$ | 96.4 | 1.9 |
| 28 | 1100 | 6 | 2130 | 79 | $1 \times 10^{10}$ | 96.0 | 1.3 |
| 29 | 1150 | 2 | 610 | 21 | $6 \times 10^{7}$ | 97.7 | 3.5 |
| 30 | 1150 | 3 | 1600 | 40 | $3 \times 10^{10}$ | 97.2 | 3.4 |
| 31 | 1150 | 4 | 1620 | 48 | $2 \times 10^{10}$ | 96.9 | 2.4 |
| 32 | 1150 | 5 | 2170 | 46 | $3 \times 10^{10}$ | 97.7 | 2.1 |
| 33 | 1150 | 6 | 1630 | 60 | $4 \times 10^{9}$ | 96.6 | 1.9 |
| 34 | 1200 | 1 | 63 | 4 | $3 \times 10^{6}$ | 96.6 | 4.7 |
| 35 | 1200 | 2 | 480 | 16 | $3 \times 10^{7}$ | 98.0 | 4.6 |
| 36 | 1200 | 3 | 1500 | 28 | $6 \times 10^{9}$ | 98.6 | 4.4 |
| 37 | 1200 | 4 | 1430 | 54 | $6 \times 10^{9}$ | 96.9 | 3.7 |
| 38 | 1200 | 5 | 1930 | 42 | $1 \times 10^{10}$ | 98.0 | 2.5 |
| 39 | 1300 | 6 | 1560 | 56 | $1 \times 10^{9}$ | 98.0 | 2.4 |
| 40 | 1250 | 5 | 1120 | 24 | $2 \times 10^{9}$ | 98.1 | 4.8 |
| 41 | 1250 | 6 | 1200 | 30 | $1 \times 10^{9}$ | 97.8 | 3.9 |
| 42 | 1250 | 7 | 1400 | 43 | $2 \times 10^{8}$ | 97.4 | 3.6 |
| 43 | 1300 | 5 | 160 | 7 | $5 \times 10^{6}$ | 98.0 | 15.4 |

We claim:

1. A sintered body of a varistor material having a particulate structure with an average grain diameter of not greater that 5 μm, a varistor electric voltage of at least 800 V/mm, a non-linear coefficient of at least 30, a specific resistivity of at least $1 \times 10^9$ ohm.cm and a composition consisting of 85-97 mole % of ZnO and 3-15 mole % of MnO.

2. A varistor material as claimed in claim 1, having a composition consisting essentially of 85-92 mole % of ZnO and 8-15 mole % of MnO.

3. A sintered body in accordance with claim 1 having a varistor electric voltage of at least 1200 V/mm.

4. A sintered body in accordance with claim 1 having a varistor electric voltage of at least 2000 V/mm.

5. A sintered body of a varistor material having a particulate structure with an average grain diameter of not greater than 5 μm, a varistor electric voltage of at least 800 V/mm, a non-linear coefficient of at least 30, a specific resistivity of at least $1 \times 10^9$ ohm.cm and a composition consisting of 85-97 mole % of ZnO and 3-15 mole % of MnO, said varistor material being produced by a method comprising the steps of:

providing an admixture containing 85-97 mol % of ZnO powder having an average particle diameter of not greater than 1 μm and 3–15 mol % of a manganese compound;

commingling said admixture in a mixer while preventing contamination of said admixture with impurity compounds of an element belonging to Group IIIb of the Periodic Table to obtain a mixture;

calcining said mixture at a temperature of 600°–900° C. in an oxygen-containing atmosphere to obtain a calcined product;

pulverizing said calcined product while preventing contamination of said calcined product with impurity compounds of an element belonging to Group IIIb of the Periodic Table to obtain a pulverized product;

molding said pulverized product to obtain a shaped body; and sintering said shaped body at a temperature of 1100°–1300° C. in an oxygen-containing atmosphere to obtain a sintered body formed of grains with an average grain diameter of not greater than 5 μm.

6. A sintered body in accordance with claim 5 having a varistor electric voltage of at least 1200 V/mm.

7. A sintered body in accordance with claim 5 having a varistor electric voltage of at least 2000 V/mm.

* * * * *